United States Patent [19]

Sooch et al.

[11] Patent Number: 5,061,925
[45] Date of Patent: Oct. 29, 1991

[54] PHASE EQUALIZATION SYSTEM FOR A DIGITAL-TO-ANALOG CONVERTER UTILIZING SEPARATE DIGITAL AND ANALOG SECTIONS

[75] Inventors: Navdeep S. Sooch; Donald A. Kerth, both of Austin; Eric J. Swanson, Buda, all of Tex.; Tetsurou Sugimoto, Zama, Japan

[73] Assignee: Crystal Semiconductor Corporation, Austin, Tex.

[21] Appl. No.: 571,376

[22] Filed: Aug. 22, 1990

[51] Int. Cl.[5] .............................................. H03M 1/10
[52] U.S. Cl. .................................. 341/120; 341/144; 375/26
[58] Field of Search ............... 341/143, 118, 120, 131, 341/139, 140, 144; 375/26, 27, 33, 34

[56] References Cited

U.S. PATENT DOCUMENTS

| | | | |
|---|---|---|---|
| 4,851,841 | 7/1989 | Sooch | 341/143 |
| 4,908,621 | 3/1990 | Polonio et al. | 341/120 |
| 4,943,807 | 7/1990 | Early et al. | 341/120 |
| 4,962,380 | 10/1990 | Meadows | 341/120 |

Primary Examiner—Todd E. DeBoer
Assistant Examiner—Brian K. Young
Attorney, Agent, or Firm—Gregory M. Howison

[57] ABSTRACT

A phase equalization system for a digital-to-analog converter (DAC) includes a digital portion (10) having an interpolation section (14) for receiving a digital input and increasing the sampling frequency thereof for input to a delta-sigma modulator (16). A summing junction (24) is disposed between the interpolation circuit (14) and the delta-sigma modudlator (16) to allow an offset voltage to be summed therewith. This provides for D.C. offset, this offset being controlled by a calibration control (40). The output of the digital section (10) is input in an analog section (12), which has a one-bit DAC 21) that is input to an analog filter (22) for converting and filtering the one-bit digital stream output by the delta-sigma modulator (16). The interpolation circuit (14) includes a three stage interpolation filter comprising a first stage (50), a second stage (52) and a third stage (54). The second stage (52) is comprised of a finite impulse response filter (FIR) that has a nonlinear phase response. The nonlinear phase response of the interpolation filter (52) compensates for the phase deviation of the analog filter (22) from a linear phase response. Therefore, the composite phase provided by the combination of the phase equalization in the digital section (10) and the phase nonlinearity in the analog section (12) will result in a linear overall phase relationship for the DAC.

12 Claims, 5 Drawing Sheets

TOTAL FREQUENCY RESPONSE

PHASE FREQUENCY RESPONSE

PHASE EQUALIZATION SYSTEM FOR A DIGITAL-TO-ANALOG CONVERTER UTILIZING SEPARATE DIGITAL AND ANALOG SECTIONS

TECHNICAL FIELD OF THE INVENTION

The present invention pertains in general to digital-to-analog converters, and more particularly, to a system for linearizing the phase of the digital-to-analog converter with phase equalization in the digital domain.

CROSS REFERENCE TO RELATED APPLICATIONS

This application is related to U.S. patent application Ser. No. 07/571,375, filed concurrent herewith.

BACKGROUND OF THE INVENTION

In the digital audio and telecommunications fields, the high accuracy and high resolution digital-to-analog conversion (DAC) technology has become one of the key analog circuit technologies. Conventionally, either the weighted network circuit technique with trimming, or the multislope integration technique has been utilized for high resolution DACs. In the weighted network, some trimming of the weighted network utilizing a laser, dynamic element matching, or the digital method utilizing Read-Only Memory (ROM), was required. This is due to the conversion accuracy, which depended in large part on the device matching tolerance of the weighted network. Typically, untrimmed weighted networks would yield a fourteen bit accuracy, whereas the trimmed network could attain a conversion accuracy of over fifteen bits. In the multislope integration circuit technique, on the other hand, integrators, sample and hold circuits and current sources are required, which of necessity must be high speed devices with relatively high accuracy. High resolution DACs utilizing this technology are difficult to realize due to the sample charge and the sample capacitor leaking through the base impedance of the transistors, which typically use bipolar technology.

Another technique that has come to the forefront in DAC technology is that utilizing oversampling conversion techniques. These typically utilize a delta-sigma modulator in conjunction with conventional oversampling noise shaping techniques utilizing digital filters. Typically, an interpolation filter is utilized to increase the sample rate and then filter all images and quantization noise at $F_s/2$ and above, $F_s$ being the input sampling frequency. The output of the interpolation filter is then processed through a sample and hold circuit to provide the oversampled output. If the interpolation filter provides a factor of $8\times$ increase in the sampling rate, the sample and hold circuit could provide another $8\times$ of increase to result in a total of $64\times$ oversampling. The delta-sigma modulator receives the output of the combined interpolation filter and sample and hold circuit and converts this oversampled signal into a one-bit data stream. This one-bit output controls a DAC, which has only two analog levels and, therefore, is substantially linear. This signal is then input to an analog low pass filter.

With the oversampling noise shaping techniques, two problems have been recognized with respect to high resolution DACs—DC offset and phase linearity. The digital portion of the DAC comprising the interpolation filter, sample and hold circuit and the delta-sigma modulator can be designed such that it is inherently linear relative to phase, and DC offset can also be provided. However, when the analog portion of the overall DAC system is implemented, an additional level of DC offset may be introduced into the system in addition to a phase response non-linearity. It is very difficult to remove DC offset and provide a non-linear phase response in the analog portion of the DAC converter system. In applications such as digital audio, this DC offset and phase response non-linearity is audible and detracts from the high quality of audio that is desired. In view of these disadvantages, it is desirable to provide a DAC system that provides a method to calibrate the DC offset for the combined digital-to-analog portions of the DAC system, and also provide an overall phase linearity for the system.

SUMMARY OF THE INVENTION

The present invention disclosed and claimed herein comprises a digital-to-analog converter with a linear phase response. A digital processing section is provided for conditioning a digital input signal received on the digital input to provide a conditioned digital signal. An analog section is provided for receiving the output of the digital processing section, converting the conditioned digital signal to an analog signal and filtering the analog signal with the filter having a predetermined phase and frequency response over the passband thereof to provide an analog output signal. A phase equalizer is provided that operates in the digital domain for adjusting the phase response of the digital processing section to compensate for variations from a linear phase response in the phase response of the analog section. This provides an overall linear phase response for the combined digital processing and analog sections.

In yet another embodiment of the present invention, the digital processing section includes an interpolation filter for receiving the digital input signal and increasing the sampling frequency thereof. The output of the interpolation filter is processed through a one-bit quantizer to provide a one-bit output stream, which one-bit output stream is input to a one-bit digital-to-analog convertor in the analog section. The one-bit quantizer comprises a delta-sigma modulator.

In a further aspect of the present invention, the interpolation filter comprises a finite impulse response filter function. The phase response of the filter function is varied to provide the phase equalization and compensate for phase variations in the phase response of the analog section.

BRIEF DESCRIPTION OF THE DRAWINGS

For a more complete understanding of the present invention and the advantages thereof, reference is now made to the following description taken in conjunction with the accompanying Drawings in which.

DETAILED DESCRIPTION OF THE INVENTION

Figure 1:
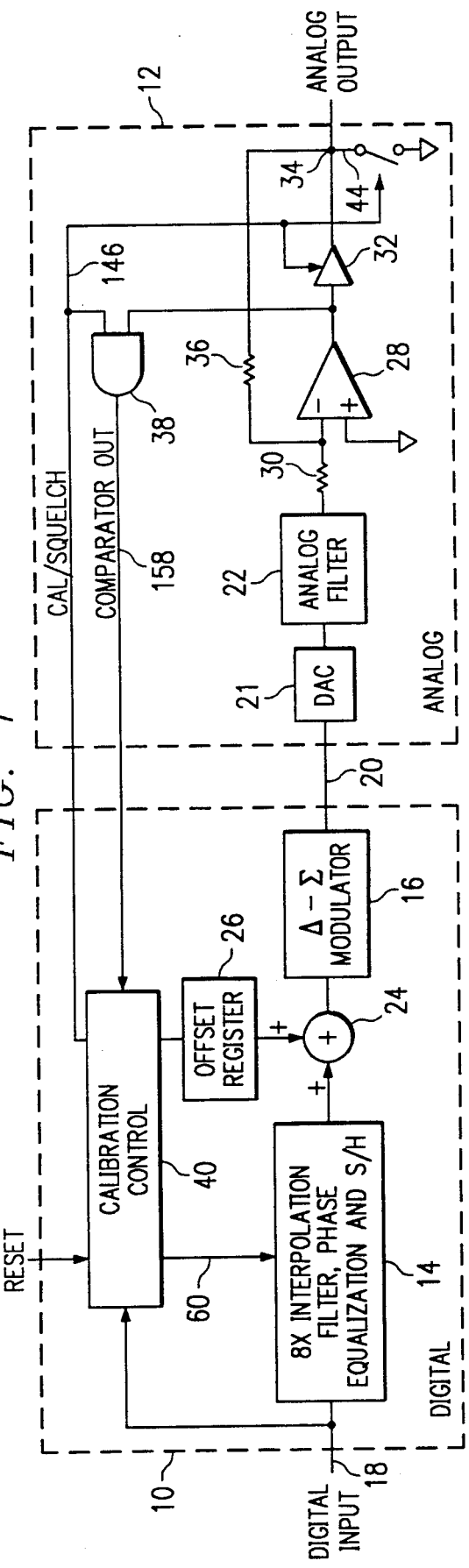
FIG. 1 illustrates a block diagram of the digital and analog portions of the DAC system with the calibration control and offset register.

Referring now to FIG. 1, there is illustrated a digital-to-analog converter system (DAC). The DAC system is comprised of a digital portion 10 and an analog portion 12. The digital portion 10 is comprised in part of an interpolation circuit 14, that includes an interpolation filter, a sample and hold circuit and a phase equalization circuit. The digital portion 10 also includes a delta-sigma modulator 16. The digital portion 10 effectively converts the digital input signal on an input 18 to a one-bit digital stream on an output 20. The output 20 is input to the analog portion 12, analog portion 12 being generally comprised of a one-bit DAC 21 and an analog low pass filter 22. Although a delta-sigma modulator is illustrated, it should be understood that any type of one-bit quantizer or equivalent can be utilized to provide the conversion to a one-bit digital stream. The delta-sigma modulator is utilized as it provides good low level performance and differential non-linearity. The general operation of the digital portion 10 is known in the art and described in Yasuykui Matsuya, Kuniharu Uchimura, Atsushi Awaiti and Takayo Kaneko, "A 17-Bit Oversampling D-to-A Conversion Technology Using Multi-Stage Noise Shaping", IEEE J. of Solid-State Circuits, Vol. 24, No. 4, August 1989, which reference is incorporated herein by reference.

The output of the interpolation circuit 14 is connected to the input of a summing circuit 24, the output of which is connected to the input of the delta-sigma modulator. The other input of the summing circuit 24 is connected to the output of an offset register 26. The contents of the offset register 26 provide a DC offset that is utilized to correct for any DC drift problems that may occur throughout the system illustrated in FIG. 1. As will be described hereinbelow, the contents of the offset register 26 are determined from an internal calibration scheme.

The analog filter 22 in the analog portion 12 has an amplifier 28 provided on the output thereof. The positive input of the amplifier 28 is connected to ground and the negative input thereof is connected through a resistive element 30 to the output of the analog filter 22. The output of amplifier 28 is connected to the input of a second stage of amplification 32, which provides a disable feature, the output of second stage 32 connected to the analog output pad associated with a node 34. A resistive element 36 is illustrated as being connected between the negative input of the amplifier 28 and the node 34. The output of amplifier 28 is input to one input of a gate circuit 38, the output of which is connected to an input of a calibration control circuit 40. The other input of the gate 38 is connected to a CAL/SQUELCH signal output by the calibration control circuit 40. The calibration control circuit 40 is operable to set the contents of the offset register 22 to an offset value. The calibration control circuit 40 also receives a digital input 18 and a reset input. The calibration control circuit 40 also outputs a control line to the interpolation circuit 14 to force the output thereof to all zeroes during a calibration cycle. For calibration purposes, a switch 44 is provided on the analog output between node 34 and ground. When node 34 is grounded, resistor 36 is also grounded through switch 44, thus causing amplifier 28 to run "open loop" and function as a comparator.

In operation, the calibration control circuit 40 is operable to initiate an internal calibration procedure that first forces the output of the interpolation circuit 14 to an all zero state, and then sets the contents of the offset register 26 to a predetermined value. This provides the primary input to the delta-sigma modulator 16. The output of the amplifier 28 is then sampled by the calibration control circuit 40 to determine if the output of the analog filter 22 is above zero. If the output of the analog filter 22 is above zero, the output of the amplifier 28 will be at a logic zero. When the output of analog filter 22 falls below zero, the output of amplifier 28 will go to a logic "1". The contents of the offset register 26 are varied through a range of values until the transition on the output of the amplifier 28 is found, thus indicating the proper offset to result in a zero output from analog filter 22 with a zero input from the interpolation circuit 14. During the calibration procedure, the switch 44 is closed and the output amplifier 32 has the output thereof disabled. Although the summing circuit 24 is illustrated as being disposed between the interpolation circuit 14 and the input of the delta-sigma modulator 16, it should be understood that the summing circuit could be placed on the digital input to the interpolation circuit 14. However, it has been determined that from a circuit design standpoint the offset operation should be disposed between the interpolation circuit and the delta-sigma modulator 16.

In order to provide linear phase for the entire DAC system, it is possible to have both a linear phase on the digital portion 10 and also a linear phase on the analog portion 12. It is a relatively straightforward manner to achieve phase linearity in the digital portion 10. However, it is more difficult to realize a linear phase response for the analog filter 22, as it takes an inordinantly high order analog filter to achieve flat magnitude, as well as linear phase. The analog filter 22 is required to keep images and quantization noise outside the passband small and, in the case where a delta-sigma modulator 16 is utilized, is also required to reduce the quantization noise. To achieve reasonable frequency rolloff for the analog filter 22, a Bessel Function filter is not usable. Therefore, the analog filter utilized would have appreciable phase non-linearity in the passband.

To compensate for the phase nonlinearity of the analog filter 22, phase equalization is performed in the digital portion 10 to compensate for the phase nonlinearities in the analog section 12. Heretofore, each section has been compensated separately. By performing the phase equalization in the digital portion 10 in the digital domain, the phase nonlinearity of the analog filter 22 can be compensated. This phase equalization has negligible impact on the overall signal-to-noise ratio of the DAC. In the preferred embodiment, the phase equalization is implemented as part of the interpolation filter. However, it should be understood that a separate phase equalizer could be utilized, separate and apart from the interpolation filter.

Figure 2:
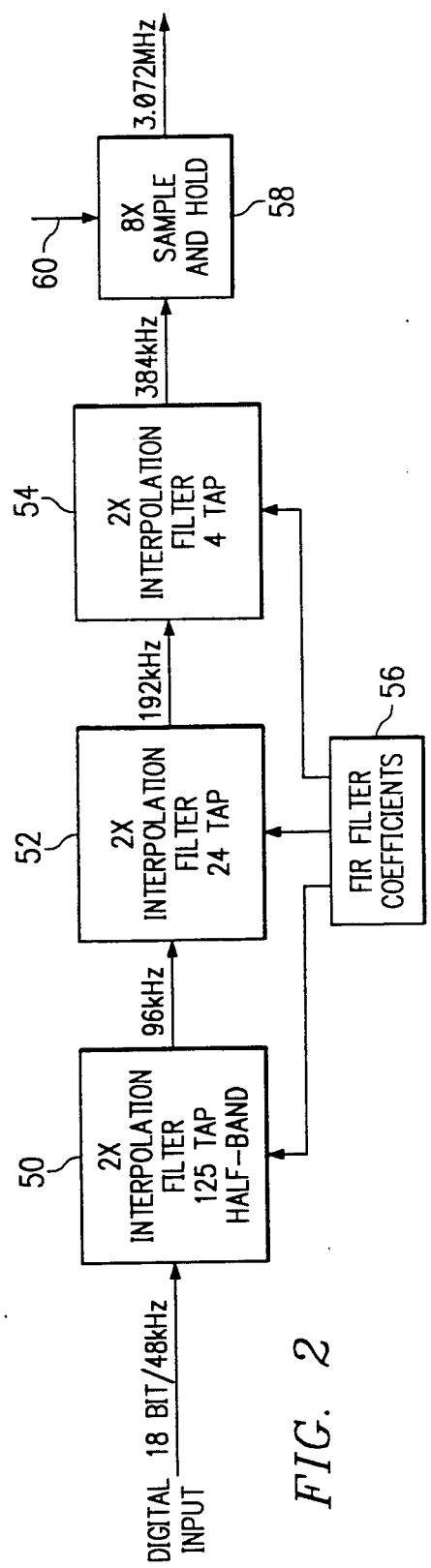
FIG. 2 illustrates a block diagram of the interpolation filter and the sample and hold circuit.

Referring now to FIG. 2, there is illustrated a block diagram of the interpolation circuit 14 including the interpolation filter and the sample and hold circuit. The interpolation filter is illustrated in a three-staged topology, a 2× interpolation filter 50, that is a one hundred twenty-five tap half band filter, a 2× interpolation filter 52, that is a twenty-four tap filter and a 2× interpolation filter 54 that is a four tap filter. The interpolation filter 50 is operable to increase the sampling frequency for an eighteen-bit 48 kHz input signal to an eighteen-bit 96 kHz signal. The interpolation filter 52 is operable to increase the sampling frequency from 96 kHz to 192 kHz and the 2× interpolation filter 54 is operable to transform the 192 kHz rate to a 384 kHz rate. The three stage topology was chosen for area and computation efficiency. The interpolation filter 52 is utilized to compensate for the phase and frequency response of the analog filter 22 in the analog section 12. However, all three interpolation filters 50, 52 and 54 could be utilized to provide compensation for this phase and frequency response. Substantial computation savings (i.e., number of multiplications per second) are realized by implementing the interpolation filter 50 with a half band filter, wherein every other coefficient is zero. The interpolation filters 52 and 54 are also realized with FIR filters, with each of the FIR filters having the associated filter coefficients stored in a memory 56. Unlike the typical FIR filters, the interpolation filter 52 has a non-linear phase response, which will be described hereinbelow.

Each of the FIR filters is realized utilizing a digital signal processing unit (DSP) that is essentially an arithmetic logic unit (ALU), which has the inputs thereof multiplexed to perform the calculations necessary to realize the filter function. Typically, digital filters are comprised of a series of multiplication and addition/subtraction steps which must be executed in a predetermined order, which order is sequential. Therefore, the digital input values are processed through each of the FIR filters 50–54 in accordance with the coefficients stored in the memory 56. This provides the filtering and interpolation function for output from the third stage interpolation filter 54.

The 384 kHz output from the third stage interpolation filter 54 is input to an 8× sample and hold circuit 58, which is operable to increase the sampling frequency to 3.072 MHz. This is then input to the summing junction 24. In addition, a control line 60 is received from the calibration control 40. The control line 60 is operable to force the output of the sample and hold circuit 58 to an "all zeroes" state for the purpose of calibration, which will be described in more detail hereinbelow.

Figure 3:
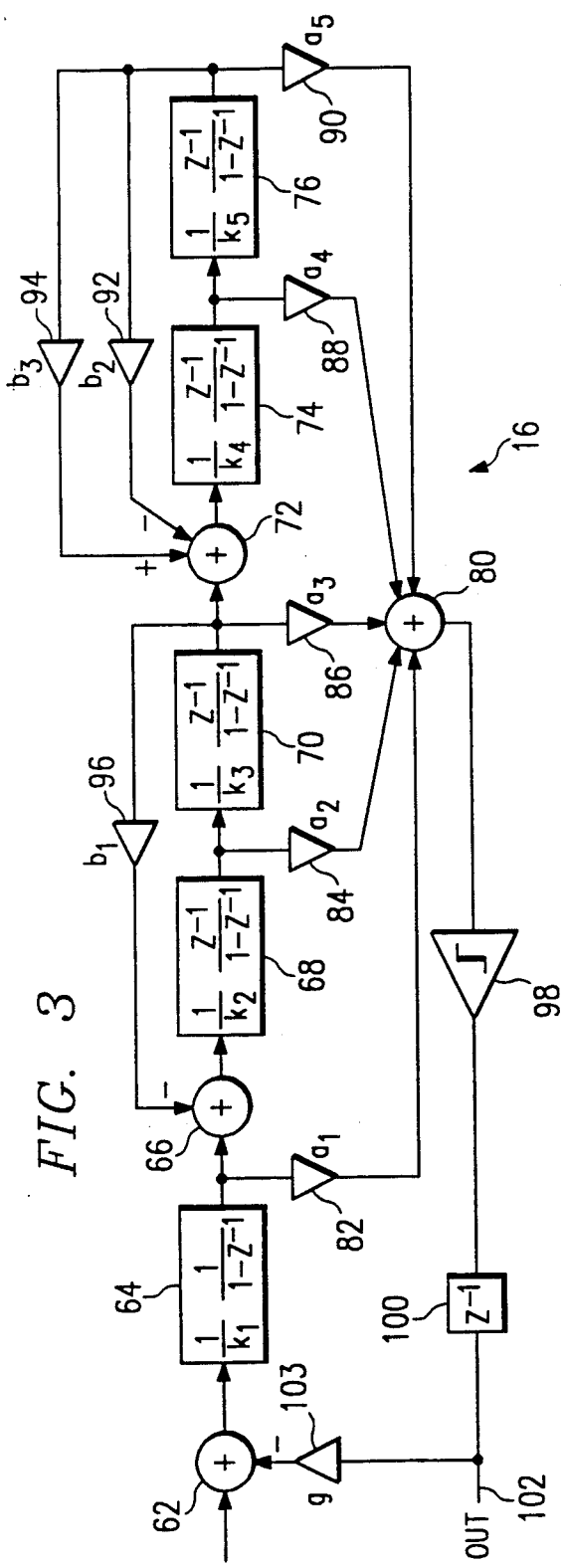
FIG. 3 illustrates a block diagram of the delta-sigma modulator.

Referring now to FIG. 3, there is illustrated a block diagram of the delta-sigma modulator 16 that converts the eighteen-bit digital signal to a one-bit digital stream. The signal output by the summing junction 24 is input to a summing junction 62 and then to a first stage of integration 64. The output of the first stage of integration 64 is input to a summing junction 66, the output of which is input to a second stage of integration 68. The output of the second stage of integration is input to the input of a third stage of integration 70. The output of the third stage of integration is input to a summing junction 72, the output of which is input to the input of a fourth stage of integration 74. The output of the fourth stage of integration 74 is input to the input of a fifth stage of integration 76. The output of each of the stages of integration 64, 68, 70, 74 and 76 are input to a summing junction 80 through feed forward paths 82, 84, 86, 88 and 90, respectively, each having coefficients $a_1$, $a_2$, $a_3$, $a_4$ and $a_5$, respectively. The output of the fifth stage of integration 76 is input to the summing junction 72 along a negative feedback path 92, having a coefficient $b_2$ associated therewith. A negative sign on the input to the summing junction 72 indicates a subtraction process. In addition, the output of the fifth stage of integration 76 is also input along a positive feedback path 94 to the input to the summing junction 72 and having a coefficient be associated therewith. A positive sign is indicated on the input of the feedback path 94 to the summing junction 72 to indicate the addition operation. A feedback path 96 is provided for connecting the output of the third stage of integration to the input of summing junction 66 at the input of the second stage of integration 68, the feedback path 96 being a negative feedback path and having a coefficient $b_1$ associated therewith.

The output of the summing junction 80 is input to a one-bit quantizer 98 that converts the output of summing junction 80 into a signal that is plus or minus full scale. The output of the quantizer 98 is passed through a delay transfer function 100 to provide the output on a line 102. The output on line 102 is also input back through a function block 103, having a coefficient g to the input of the summing block 62 to sum with the digital input signal to the delta-sigma modulator 16. The structure of FIG. 3, therefore, realizes a fifth order delta-sigma modulator. The coefficients for the fifth order modulator illustrated in FIG. 3 are listed in TABLE 1.

TABLE 1

| Delta-Sigma Modulator Coefficients | | | | |
|---|---|---|---|---|
| $k_1$ | 1 | $a_1$ | 1 | $b_1$ | 1/1024 |
| $k_2$ | 1 | $a_2$ | ½ | $b_2$ | 1/16 |
| $k_3$ | ½ | $a_3$ | ¼ | $b_3$ | 1/64 |
| $k_4$ | ¼ | $a_4$ | ½ | g | 2.5 |
| $k_5$ | ½ | $a_5$ | ½ | | |

Figure 4:
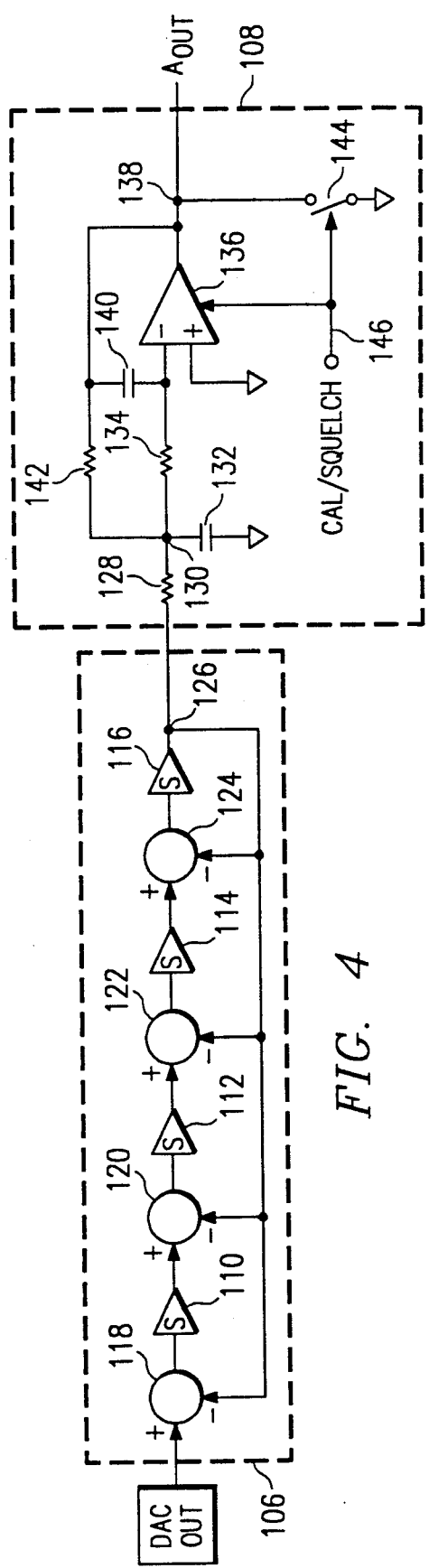
FIGS. 4, 4a and 4b illustrate schematic diagrams of the switched capacitor filter and continuous filter that comprise the analog low pass filter.

Referring now to FIG. 4, there is illustrated a schematic block diagram of the analog section 12 including the analog filter 22. The analog filter 22 is comprised of two sections, a switched capacitor filter 106, and a continuous time filter section 108. The switched capacitor filter section 106 comprises a fourth order Butterworth low-pass filter, whereas the continuous time filter section 108 is comprised of a second order Butterworth low-pass filter.

The switched capacitor filter section 106 is comprised of four switched capacitor stages, 110, 112, 114 and 116. The analog input is input to the positive input of a summing junction 118, the output of which is connected to the input of the first switched capacitor stage 110. The first switched capacitor stage functions as the one-bit DAC 21. The output of the switched capacitor stage 110 is input to the positive input of a summing junction 120. The output of summing junction 120 is input to the input of the second switched capacitor stage 112, the output of which is connected to the positive input of summing junction 122. The output of summing junction 122 is input to the input of the third switched capacitor stage 114, the output of which is connected to the positive input of a summing junction 124. The output of summing junction 124 is input to the input of a switched capacitor stage 116, the output of which is connected to a node 126. Node 126 is fed back to the negative inputs of each of the summing junctions 118, 120, 122 and 124.

The continuous time filter section 108 has the input thereof connected to node 126, node 126 being connected through a resistor 128 to a node 130. A capacitor 132 has one plate thereof connected to node 130, and the other plate thereof connected to ground. Node 130 is connected through a resistor 134 to the negative input of an amplifier 136, the positive input of which is connected to ground. The amplifier 136 is essentially an op amp for the purposes of realizing the filter. The output of the amplifier 136 is connected to the analog output pad at node 138. Node 138 is connected through a series capacitor 140 to the negative input of the amplifier 136. Node 138 is also connected through a resistor 142 to the node 130. A switch 144 is connected between the analog output pad at node 138 to ground. A control signal CAL/SQUELCH is input on a line 146 to both the amplifier 136 and the switch 144. As will be described hereinbelow, the control line 146 is operable to disable the output of the amplifier 136 from the analog output node 138 and also close switch 144 during a calibration operation. This will cause the first stage of amplifier 136 to function as a comparator.

Figure 4A:
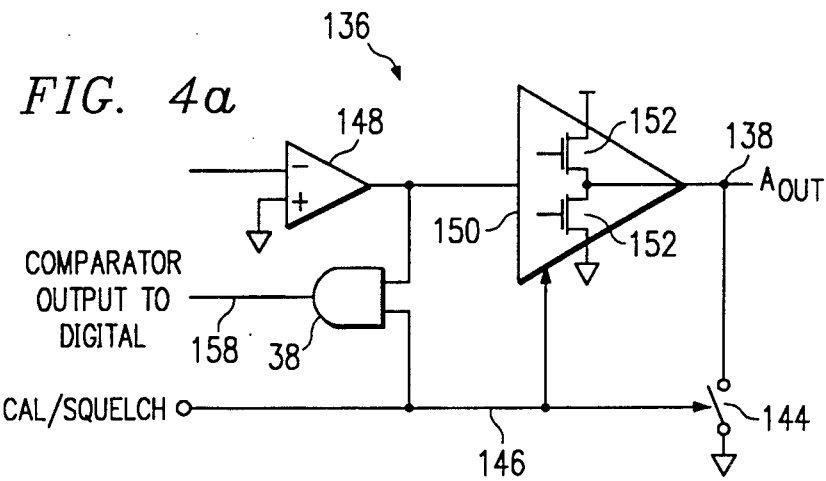

Referring now to FIG. 4a, there is illustrated a more detailed view of the amplifier 136. The amplifier 136 is comprised of a first stage 148 and an output stage 150. The output stage 150 has two CMOS transistors 152 disposed therein, one having the source/drain path connected between the positive supply and the output node 138 and one transistor having the source/drain path connected between the node 138 and ground. The transistors 152 are controlled by the CAL/SQUELCH signal on line 146 to isolate the node 138 from the output of first stage 148. The output of stage 148 provides the comparator operation, which output is connected to one input of the gate 38. The other input of gate 38 is connected to the line 146. Therefore, when the calibration operation is initiated, switch 144 is closed and node 138 is grounded.

Figure 4B:
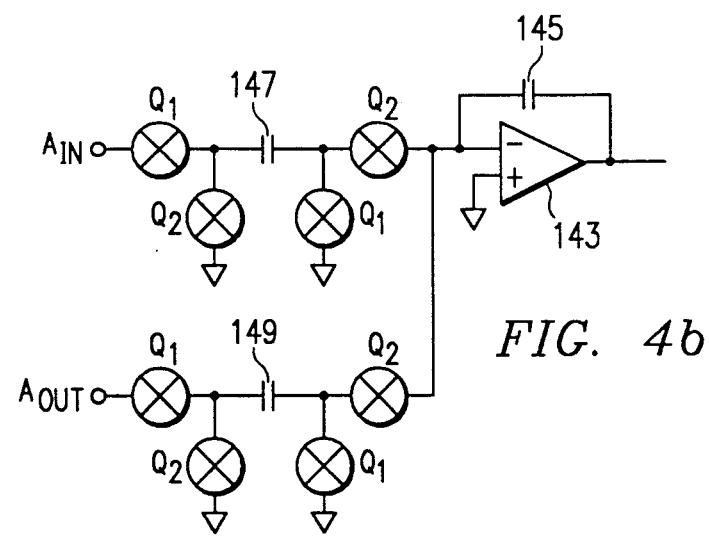

Referring now to FIG. 4b, there is illustrated a detail of each of the switched capacitor stages 110-116. Each of the stages is comprised of an amplifier stage 143, having a feedback capacitor 145 disposed between the negative input thereof and the output. A switched capacitor 147 is provided on the input, which is connected from the output of the preceding one of the summing junctions 118-124 with appropriate switches disposed thereabout. The switches are controlled by signals $\phi_1$ and $\phi_2$. In a similar manner, the feedback leg has a switched capacitor 149 disposed in series therewith and input to the negative input of the amplifier 143. Similar switches are provided in a switched capacitor configuration and controlled by the timing signals $\phi_1$ and $\phi_2$. This is a conventional structure.

Figure 5:
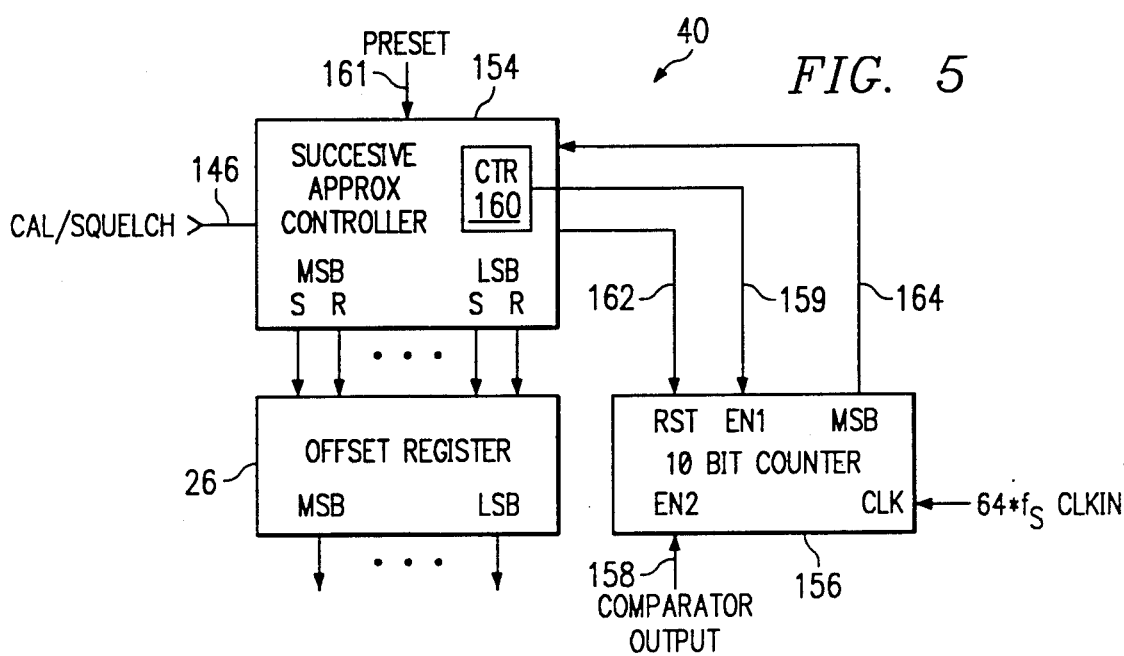
FIG. 5 illustrates a logic diagram for the calibration control system and offset register.

Referring now to FIG. 5, there is illustrated a block diagram of a calibration control circuit 40. The offset register is a 16 bit register. A successive approximation controller 154 is provided and is operable to interface with the offset register 26. The offset register 26 has the 16 bits thereof extending from an LSB to an MSB. The successive approximation controller 154 is operable to either reset each of the bits in the offset register 26 to a logic "0" or to set each of the bits to a logic "1". The successive approximation controller 154 is operable to initially reset all of the registers in the offset register 26 to a logic "0" and then successively set each bit high, beginning with the MSB, wait for a reset signal, if appropriate, at the end of a cycle, which when it occurs will reset the bit back to zero, and then cycle to the next lower bit. The CAL/SQUELCH signal is input to the successive approximation controller 154 on the line 146 to initiate the operation.

A ten-bit counter 156 is provided having two enable inputs, EN1 and EN2, which are operable to enable the counter 156. The enable input EN1 is connected through a line 159 to an output from the successive approximation controller 154. The signal output on line 159 is generated by an internal counting circuit 160. A reset signal is output by the successive approximation controller 154 on a line 162 to reset the ten-bit counter for each bit tested by the successive approximation controller 154. The MSB of the counter 156 is provided as an output on a line 164 to a reset input on the successive approximation controller 154. As will be described hereinbelow, a line 164 and the signal thereon are operable to prevent the bit being tested from being reset to a logic "0". The comparator output on the line 158 is input to the EN2 enable input and, when combined with the clock input, increments the counter 156. The clock input is connected to a signal that is 64 times the sampling frequency $F_s$.

Figure 5A:
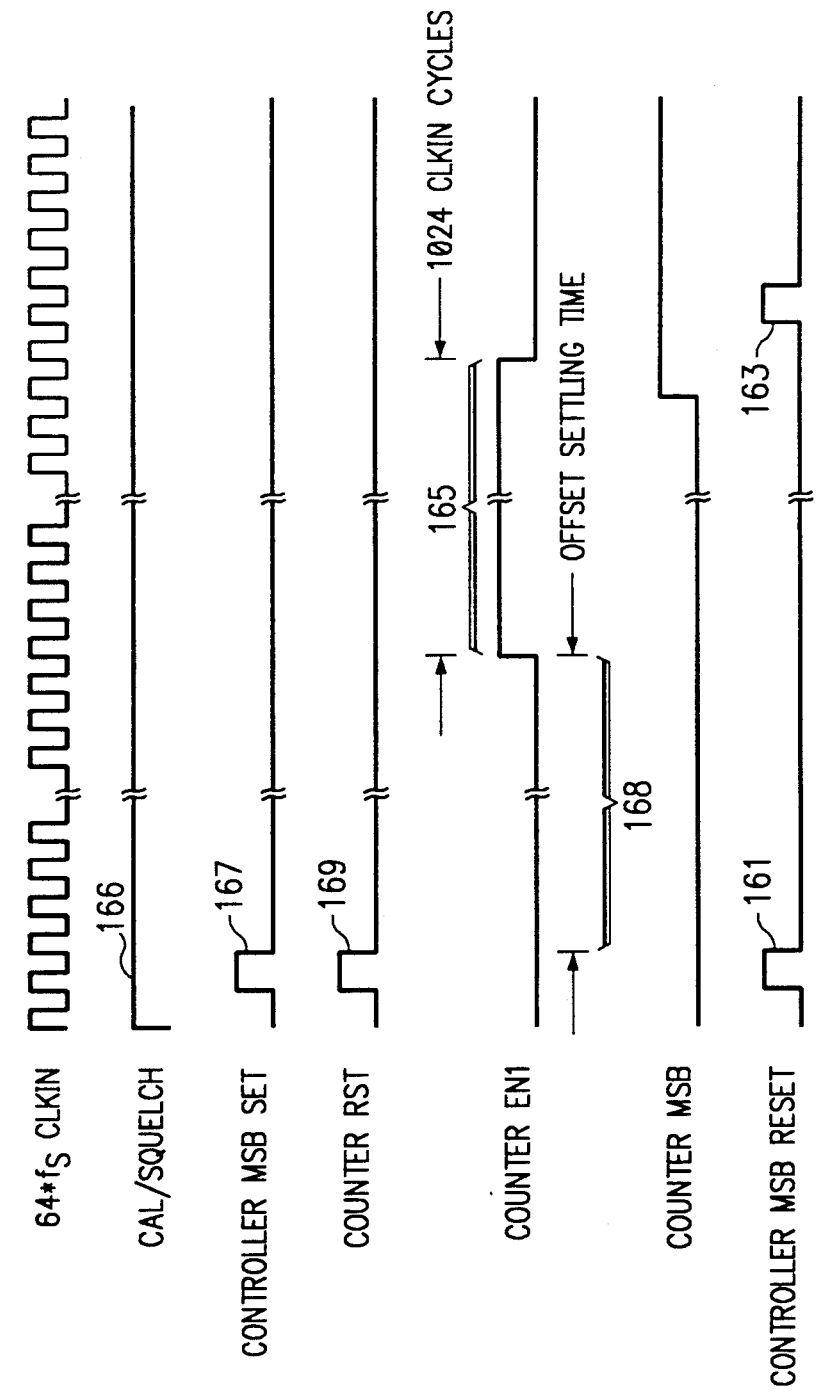
FIG. 5a illustrates a timing diagram for the calibration control circuit.

Referring now to FIG. 5a, there is illustrated a timing diagram for the calibration operation. The CAL/SQUELCH signal is represented by a pulse 166, the rising edge of which initiates the calibration procedure. The controller 154 MSB is represented by a second pulse 167 that follows the pulse 166. A counter reset signal 169 is generated at the same time as the pulse 167, and is output on line 162 to the counter 156 to reset the count value therein to zero. The EN1 enable input to counter 156 on line 159 is maintained at a low level for a predetermined settling time 168. This settling time is provided to allow the DAC to settle for a predetermined amount of time after a new input value has been applied to the input of the DAC, this input being all logic "0"s at the input to the summing junction 24. Typically, the analog low pass filter 22 is the primary circuit component that accounts for this need. The enable line 159 then goes high, as represented by a pulse 165, for 1024 clock cycles, this being the same clock that is input to the ten-bit counter 156. The counting function is provided by counter 160. At the end of the 1024 clock cycles, the counter MSB line 164 is sampled as a reset signal, which when it is high, does not reset the particular bit. The reset function occurs at a pulse 163 which, if the counter MSB is low, results in the resetting of the bit to zero. Thereafter, the next adjacent bit to the MSB is set, the DAC allowed to settle for the offset settling time indicated by reference number 168, and then the comparator output sampled over 1024 clock cycles. This continues for all sixteen bits.

The successive approximation controller in a second mode is allowed to receive a signal on a Preset input 161. The Preset input 161 forces a bit other than the MSB bit to be the first bit set in the successive approximation routine. In addition, when the Preset signal 161 is utilized, the CAL/SQUELCH signal does not reset all of the bits in the offset register 26. The value in the register is maintained such that the search can proceed in a shorter time.

The calibration control circuit 40, as described above, is operable to generate the CAL/SQUELCH signal in response to an external reset signal. In addition, the calibration control signal 4 is operable to be connected to the digital input 118 and detect when all of the bits thereof are at a logic "0" for a predetermined period. In this condition, the calibration control circuit 40 generates the CAL/SQUELCH signal. In this manner, a low noise grounded output is provided whenever the DAC output is at a true zero input value. Whenever this mode is entered, the calibration control 40 is operable to reset the bit position counter 156 such that the calibration does not start from a zero offset value. Rather, it starts from an offset value that is slightly less than the previously stored offset value in offset register 26. In this manner, it is not necessary to go through the entire binary search provided by the bit control circuit 154, but rather through a modified search.

Although the above calibration procedure was described with reference to a zero offset, the gain of the delta-sigma modulator 16 could be adjusted. This would require a measurement of two voltages, a low voltage and a high voltage, for a known input. The known input could be summed into summing circuit 24 through the offset register 26 and then a measurement taken. A calculation could be made and the gain of the delta-sigma modulator adjusted. This would be very similar to the procedure described in U.S. Pat. No. 4,943,807, issued to Early, et al., on July 24, 1990, and assigned to the present assignee, which patent is incorporated herein by reference.

Figure 6:
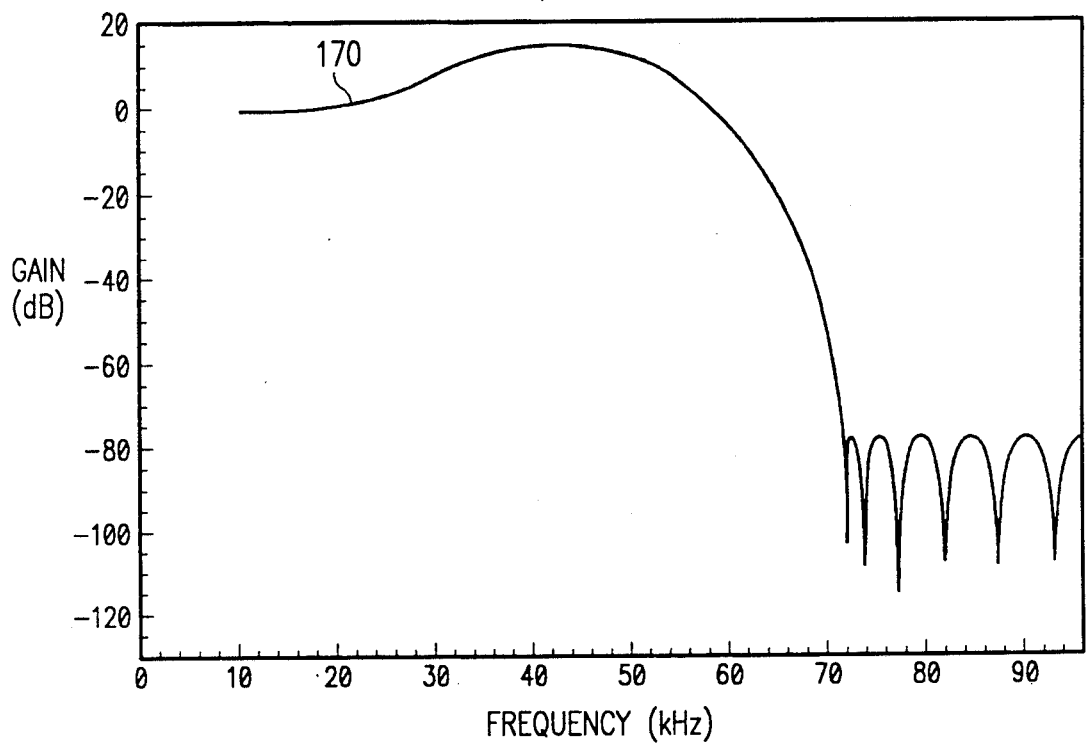
FIG. 6 illustrates a plot of the magnitude response of the intermediate interpolation filter.

Referring now to FIG. 6, there is illustrated a plot of the magnitude response as a function over frequency for the interpolation filter 52. The interpolation filter 52, as described above, is a twenty-four tap filter. The frequency response is relatively flat with peaking beginning at approximately 22 kHz, at a point 170. This magnitude response peaks around 40 kHz at +15.0 dB to provide some gain. It then falls off to a first zero at around 70 kHz. The magnitude response is tailored in the design of the interpolation filter 52 to compensate for the magnitude response of the analog filter at the edge of the passband, which is approximately 20 kHz.

Figure 7:
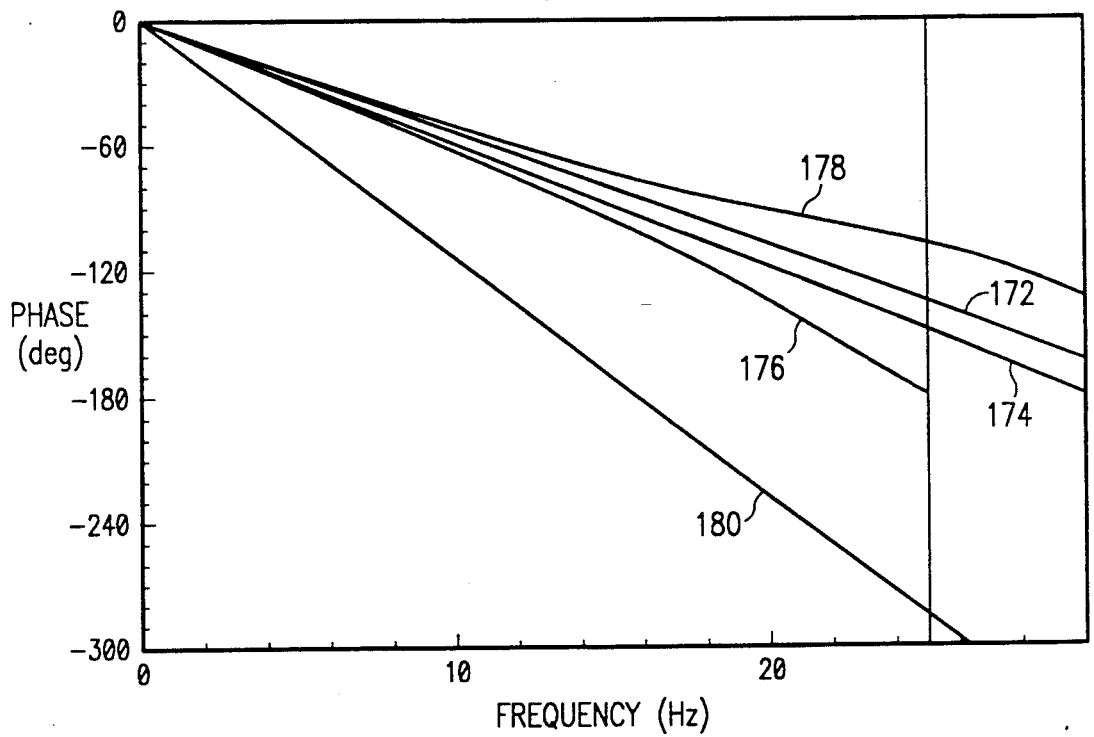
FIG. 7 illustrates a plot of the phase response of the analog filter and the intermediate interpolation filter and the composite response thereof.

Referring now to FIG. 7, there is illustrated a plot of the phase response for both the analog low pass filter 22 and the interpolation filter 52. Since, as described above, the phase response of the other two interpolation filters 50 and 54 are linear, the linearity of the interpolation filter 52 will determine the overall phase response of the digital section 10. Phase is plotted versus frequency on the x-axis and phase on the y-axis. The phase extends from 8° to −300°. A line 172 is provided, which represents the linear phase line for the interpolation filter 52, if it were designed to have linear phase, such as for a symmetric FIR filter.

A line 174 is illustrated, which represents the linear phase response for the analog low pass filter 22. One aspect of the present invention is to tailor the phase response of the interpolation filter 52 to compensate for phase deviation of the analog low pass filter 22. Therefore, any deviation from the linear phase response represented by line 74 by the analog low pass filter 22 would be compensated for by an equal and opposite phase variation of the interpolation filter 52 from the linear phase represented by line 172. The actual phase of the analog low pass filter 22 is represented by a curve 176. It can be seen that the curve 176 is tangent to the line 174 for frequencies below 10 kHz, but deviates significantly at frequencies around 20 kHz. The phase of the interpolation filter 52 is designed to deviate in the opposite direction relative to the linear phase line 172, the actual phase of the interpolation filter 52 being represented by a curve 178. The composite phase of the interpolation filter 52 in the analog low pass filter 52 is represented by a curve 180. This is essentially the composite of curves 176 and 180. It can be seen that the curve 180 is essentially representative of a linear phase variation.

In summary, there has been provided a phase equalization system for a digital-to-analog converter. The digital-to-analog converter is comprised of a digital section for processing the received digital signal to an analog signal, and an analog section for filtering out images and quantization noise outside the pass band. The nonlinearities in the phase response of the analog section are compensated for by phase equalization in the digital section.

Although the preferred embodiment has been described in detail, it should be understood that various changes, substitutions and alterations can be made therein without departing from the spirit and scope of the invention as defined by the appended claims.

What is claimed is:

1. A digital-to-analog converter with linear phase, comprising:
    a digital input terminal;
    an analog output terminal;
    a digital processing section for conditioning a digital input signal received on said digital input terminal to provide a conditioned digital output signal, said digital processing section having a predetermined phase response;
    an analog section having a predetermined phase response over the passband of said analog section for receiving the output of said digital processing section, converting the conditioned digital output signal to an analog signal and filtering out images and quantization noise generated by said digital processing section that are outside the passband of said analog section; and
    a phase equalizer operating in the digital domain and associated with said digital processing section for adjusting the phase response of said digital processing section to compensate for variations from a linear phase response of the phase response of said analog section to provide a substantially linear phase response for the combination of said digital processing section and said analog section.

2. The digital-to-analog converter of claim 1, wherein said analog section comprises an analog low pass filter.

3. The digital-to-analog converter of claim 1, wherein said digital processing section comprises:
    an interpolation filter for receiving said digital input signal and increasing the sampling frequency thereof;
    an n-bit quantizer for receiving the output of said interpolation filter and outputting a n-bit digital stream for input to said analog section; and
    said analog section including a n-bit digital-to-analog convertor to convert the one bit digital stream to a converted signal.

4. The digital-to-analog converter of claim 3, wherein said n-bit quantizer comprises a delta-sigma modulator.

5. The digital-to-analog converter of claim 3, wherein said interpolation filter comprises a finite impulse response filter function.

6. The digital-to-analog converter of claim 3, wherein said interpolation filter includes means for adjusting the phase of said interpolation filter to comprise said phase equalizer and to provide said compensation for the variations from a linear phase response of the phase response of said analog section.

7. A method for linearizing the phase response of a digital-to-analog converter comprising:
    receiving a digital input signal on a digital input;

processing a digital signal to condition the digital input signal to provide a conditioned digital output signal;

converting the conditioned digital output signal to an analog signal;

filtering the analog signal in the analog domain over a predetermined passband to filter out images and quantization noise that occur outside of the passband to provide an analog output signal on an analog output; and adjusting the phase response in the digital domain to compensate for variations from a linear phase response of the filtering step in the analog domain;

wherein a substantially linear phase response is provided for the combined operation of converting the digital signal to an analog signal and filtering in the analog domain.

8. The method of claim 7, wherein the step of filtering comprises processing the analog signal output by the step of converting with a low pass filter.

9. The method of claim 7, wherein the step of processing the digital input signal in the digital domain and converting it to an analog signal comprises:

providing an interpolation filter;

processing the digital signal through the interpolation filter to increase the sampling frequency thereof; and converting the digital input signal in the digital domain to a n-bit stream with a n-bit quantizer.

10. The method of claim 9, wherein the step of converting the digital signal output by the interpolation filter to a n-bit digital stream comprises processing the digital signal output by the interpolation filter through a delta-sigma modulator.

11. The method of claim 9, wherein the interpolation filter has a finite impulse response filter function.

12. The method of claim 9, wherein the step of equalizing the phase comprises adjusting the phase of the phase response of the interpolation filter.

* * * * *